United States Patent
Ko

(10) Patent No.: US 6,940,476 B2
(45) Date of Patent: Sep. 6, 2005

(54) ACTIVE MATRIX ORGANIC ELECTROLUMINESCENT DISPLAY DEVICE AND METHOD OF FABRICATING THE SAME

(75) Inventor: Doo-Hyun Ko, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 288 days.

(21) Appl. No.: 10/327,885

(22) Filed: Dec. 26, 2002

(65) Prior Publication Data

US 2003/0128173 A1 Jul. 10, 2003

(30) Foreign Application Priority Data

Dec. 29, 2001 (KR) ................................ 10-2001-0088540

(51) Int. Cl.⁷ ................................................ G09G 3/30
(52) U.S. Cl. ...................... 345/76; 315/169.3; 313/498
(58) Field of Search ............................ 345/76–82, 296, 345/298, 300, 308; 315/169.1, 169.3; 313/498, 505, 506; 257/296, 298, 300, 308

(56) References Cited

U.S. PATENT DOCUMENTS

| | | | | |
|---|---|---|---|---|
| 6,194,837 B1 | * | 2/2001 | Ozawa .................... | 315/169.1 |
| 6,661,180 B2 | * | 12/2003 | Koyama .................. | 315/169.3 |
| 6,674,245 B2 | * | 1/2004 | Ko et al. ................. | 315/169.3 |
| 6,703,992 B1 | * | 3/2004 | Yamada ................... | 345/76 |
| 6,781,320 B2 | * | 8/2004 | Park et al. ............... | 315/169.1 |
| 6,781,321 B2 | * | 8/2004 | Ko et al. ................. | 315/169.3 |
| 6,791,129 B2 | * | 9/2004 | Inukai ..................... | 257/208 |

* cited by examiner

Primary Examiner—Bipin Shalwala
Assistant Examiner—Tom Sheng
(74) Attorney, Agent, or Firm—Morgan, Lewis & Bockius LLP

(57) ABSTRACT

An active matrix organic electroluminescent display device includes a substrate, a gate line disposed on the substrate, a data line disposed on the substrate crossing the gate line to form a pixel region, a first switching thin film transistor disposed on the substrate and electrically connected to the gate line and the data line, a first driving thin film transistor disposed on the substrate and electrically connected to the first switching thin film transistor, a capacitor electrode formed on the substrate and electrically connected to the first switching thin film transistor, the capacitor electrode having first and second parts disposed in parallel to the data line, and a third part connecting a first end of the first part to a first end of the second part, a power line electrically connected to the first driving thin film transistor, the power line having first, second, and third portions overlapping the capacitor electrode to form a storage capacitor, a pixel electrode disposed within the pixel region and electrically connected to the first driving thin film transistor, an organic emissive layer disposed on the pixel electrode, and a partition wall disposed between adjacent organic layers to overlap the data line and the first and second parts of the capacitor electrode.

26 Claims, 6 Drawing Sheets

US 6,940,476 B2

ACTIVE MATRIX ORGANIC ELECTROLUMINESCENT DISPLAY DEVICE AND METHOD OF FABRICATING THE SAME

The present invention claims the benefit of Korean Patent Application No. 2001-88540 filed in Korea on Dec. 29, 2001, which is hereby incorporated by reference.

BACKGROUND OF THE INVENTION

1. Field of the Invention

The present invention relates to an electroluminescent display device, and more particularly, to an active matrix organic electroluminescent display device.

2. Discussion of the Related Art

Cathode ray tubes have been commonly used as a display device in televisions and computer monitors. However, the cathode ray tubes are large, heavy, and require a high driving voltage. In contrast, flat panel displays have thin profiles, are light weight, and have low power consumption. The different types of flat panel displays include liquid crystal display (LCD) devices, plasma display panel (PDP) devices, field emission display (FED) devices, and electroluminescence display (ELD) devices.

The ELD devices may be categorized into inorganic electroluminescent display (IELD) devices and organic electroluminescent display (OELD) devices depending on a source material for exciting carriers. The organic electroluminescent displays have developed because of their high brightness, low driving voltage, and production of colors within the visible light range. In addition, the organic electroluminescent displays have a superior contrast ratio because of its self-luminescence. The organic electroluminescent display devices can easily display moving images because of their short microsecond response time and unlimited viewing angle. The organic electroluminescent display devices are stable at low temperatures, and have driving circuitry that can be easily fabricated because of their low voltage driving characteristics. In addition, manufacturing processes of the organic electroluminescent display devices are relatively simple.

In general, OELD emit light by injecting electrons from a cathode electrode and holes from an anode electrode into a luminous layer, combining the electrons with the holes to generate an exciton, and transiting the exciton from an excited state to a ground state. Since the OELD uses a luminous mechanism similar to light emitting diodes, the organic electroluminescence display device may be called an organic light emitting diode (OLED).

The OELD devices may be classified into passive matrix-type and active matrix-type according to a method for driving. The passive matrix-type OLED has a simple structure and is manufactured through a simple process. However, the passive matrix-type OLED devices require high power consumption, thereby limiting overall size. In addition, in the passive matrix-type OELD devices, an aperture ratio decreases according to an increase in a total number of conductive lines. Thus, the passive matrix-type OELD devices are commonly used as small-sized display devices. On the other hand, the active matrix organic electroluminescence display (AMOELD) devices are commonly used in large-sized display devices.

FIG. 1 is an equivalent circuit diagram for a pixel of an active matrix-type organic electroluminescent display (AMOELD) device according to the related art. In FIG. 1, a pixel of an AMOELD device includes a switching thin film transistor (TFT) 5, a driving thin film transistor (TFT) 6, a storage capacitor 7, and an electroluminescent diode 8. A gate electrode of the switching TFT 5 is electrically connected to a gate line 1 and a source electrode of the switching TFT 5 is electrically connected to a data line 2. A drain electrode of the switching TFT 5 is electrically connected to a gate electrode of the driving TFT 6, a drain electrode of the driving TFT 6 is electrically connected to an anode electrode of the electroluminescent diode 8, and a source electrode of the driving TFT 6 is electrically connected to a power line 4. A cathode electrode of the electroluminescent diode 8 is grounded, and the storage capacitor 7 is electrically connected to the gate electrode and the source electrode of the driving TFT 6.

When a signal is applied to the gate electrode of the switching TFT 5 through the gate line 1, the switching TFT 5 turns ON. Accordingly, a signal from the data line 2 is transmitted to the gate electrode of the driving TFT 6 through the switching TFT 5 and is stored in the storage capacitor 7. Then, the driving TFT 6 turns ON by the signal from the data line 2, and a signal from the power line 4 is transmitted to the electroluminescent diode 8 through the driving TFT 6. Therefore, light is emitted from the electroluminescent diode 8. Brightness of the device of FIG. 1 is regulated by controlling current passing through the electroluminescent diode 8. Accordingly, though the switching TFT 5 turns OFF, the driving TFT 6 maintains an ON state due to the signal stored in the storage capacitor 7. Thus, light is emitted by current continuously passing through the electroluminescent diode 8 until the next signal is transmitted to the gate electrode of the driving TFT 6 through the switching TFT 5.

FIG. 2 is a plan view for a pixel of an active matrix-type organic electroluminescent display device according to the related art. In FIG. 2, a gate line 21 and a data line 22 cross each other and define a pixel region "P," and switching TFT "$T_S$" is formed at the crossing of the gate line 21 and the data line 22, and is connected to the gate line 21 and the data line 22. A driving TFT "$T_D$" is formed within the pixel region "P." A gate electrode 41 of the driving TFT "$T_D$" is connected to a drain electrode 31 of the switching TFT "$T_S$," a source electrode 42 of the driving TFT "$T_D$" is connected to a power line 51, and a drain electrode 43 of the driving TFT "$T_D$" is connected to a pixel electrode 61. The power line 51 is formed parallel to the data line 22, and the pixel electrode 61 is formed within the pixel region "P."

A first capacitor electrode 52 extends from the power line 51 and is disposed within the pixel region "P". Next, a second capacitor electrode having a first part 71 and a second part 72 is formed, wherein the first and second parts 71 and 72 overlap the power line 51 and the first capacitor electrode 52, respectively, and form a storage capacitor. The second capacitor electrode first part 71 and second part 72 are made of polycrystalline silicon. A partition wall 80 is formed corresponding to the data line 22 and the power line 51 in order to prevent an organic emissive layer (not shown), which will be formed on the pixel electrode 61, from contacting that of the adjacent pixel region "P".

In the AMOELD device, the capacitance of the storage capacitor should be large to reduce a kick-back voltage that causes poor image display. The capacitance of the storage capacitor is proportional to a size of the electrode of the storage capacitor, and since the power line 51 and the first capacitor electrode 52 being electrodes of the storage capacitor is opaque, an aperture ratio of the AMOELD device is reduced.

SUMMARY OF THE INVENTION

Accordingly, the present invention is directed to an active matrix organic electroluminescent display device and method of fabricating the same that substantially obviates one or more of problems due to limitations and disadvantages of the related art.

An object of the present invention is to provide an active matrix organic electroluminescent display device that has a storage capacitor of a large capacitance and a high aperture ratio.

Another object of the present invention is to provide a method of fabricating an active matrix organic electroluminescent display device that has a storage capacitor of a large capacitance and a high aperture ratio.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescent display device includes a substrate, a gate line disposed on the substrate, a data line disposed on the substrate crossing the gate line to form a pixel region, a first switching thin film transistor disposed on the substrate and electrically connected to the gate line and the data line, a first driving thin film transistor disposed on the substrate and electrically connected to the first switching thin film transistor, a capacitor electrode formed on the substrate and electrically connected to the first switching thin film transistor, the capacitor electrode having first and second parts disposed in parallel to the data line, and a third part connecting a first end of the first part to a first end of the second part, a power line electrically connected to the first driving thin film transistor, the power line having first, second, and third portions overlapping the capacitor electrode to form a storage capacitor, a pixel electrode disposed within the pixel region and electrically connected to the first driving thin film transistor, an organic emissive layer disposed on the pixel electrode, and a partition wall disposed between adjacent organic layers to overlap the data line and the first and second parts of the capacitor electrode.

In another aspect, a method of fabricating an active matrix organic electroluminescent display device includes forming a gate line on a substrate, forming a data line on the substrate crossing the gate line to form a pixel region, forming a first switching thin film transistor on the substrate and electrically connected to the gate line and the data line, forming a first driving thin film transistor on the substrate and electrically connected to the first switching thin film transistor, forming a capacitor electrode electrically connected to the first switching thin film transistor, the capacitor electrode having first and second parts disposed in parallel to the data line, and a third part connecting a first end of the first part to a first end of the second part, forming a power line electrically connected to the first driving thin film transistor, the power line having first, second, and third portions overlapping the capacitor electrode to form a storage capacitor, forming a pixel electrode disposed within the pixel region and electrically connected to the first driving thin film transistor, forming an organic emissive layer disposed on the pixel electrode, and forming a partition wall disposed between adjacent organic layers to overlap the data line and the first and second parts of the capacitor electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
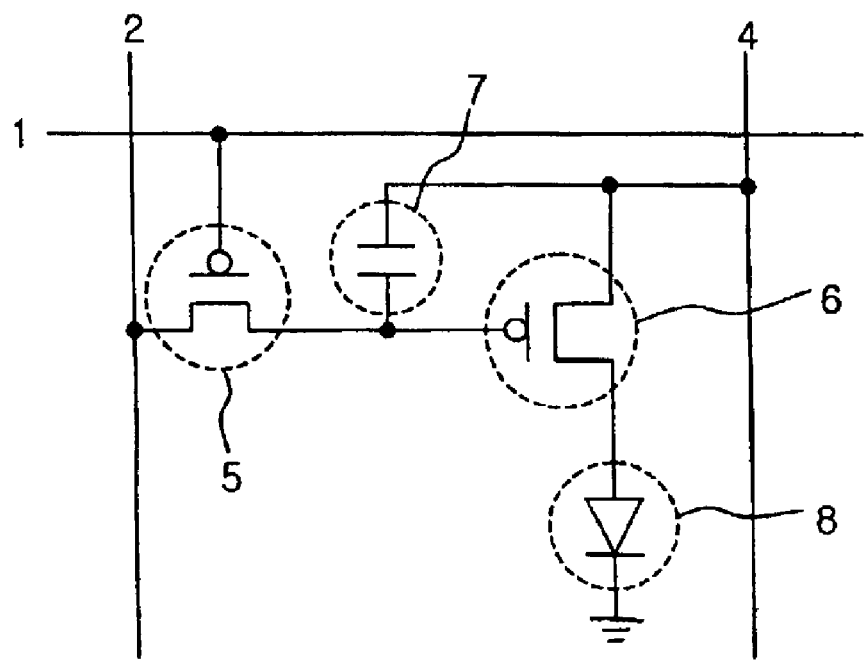
FIG. 1 is an equivalent circuit diagram for a pixel of an active matrix-type organic electroluminescent display device according to the related art.
Figure 2:
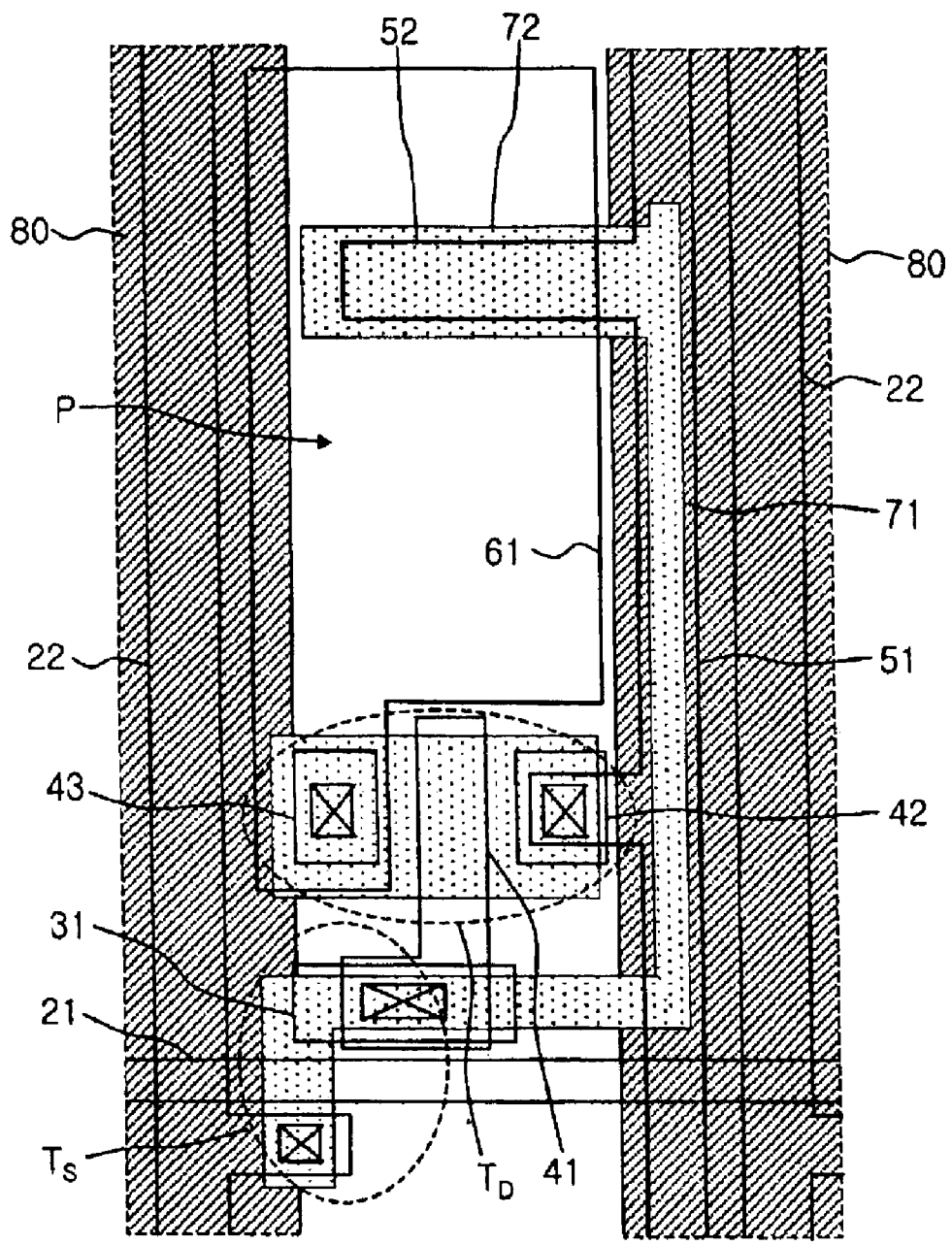
FIG. 2 is a plan view for a pixel of an active matrix-type organic electroluminescent display device according to the related art.
Figure 3:
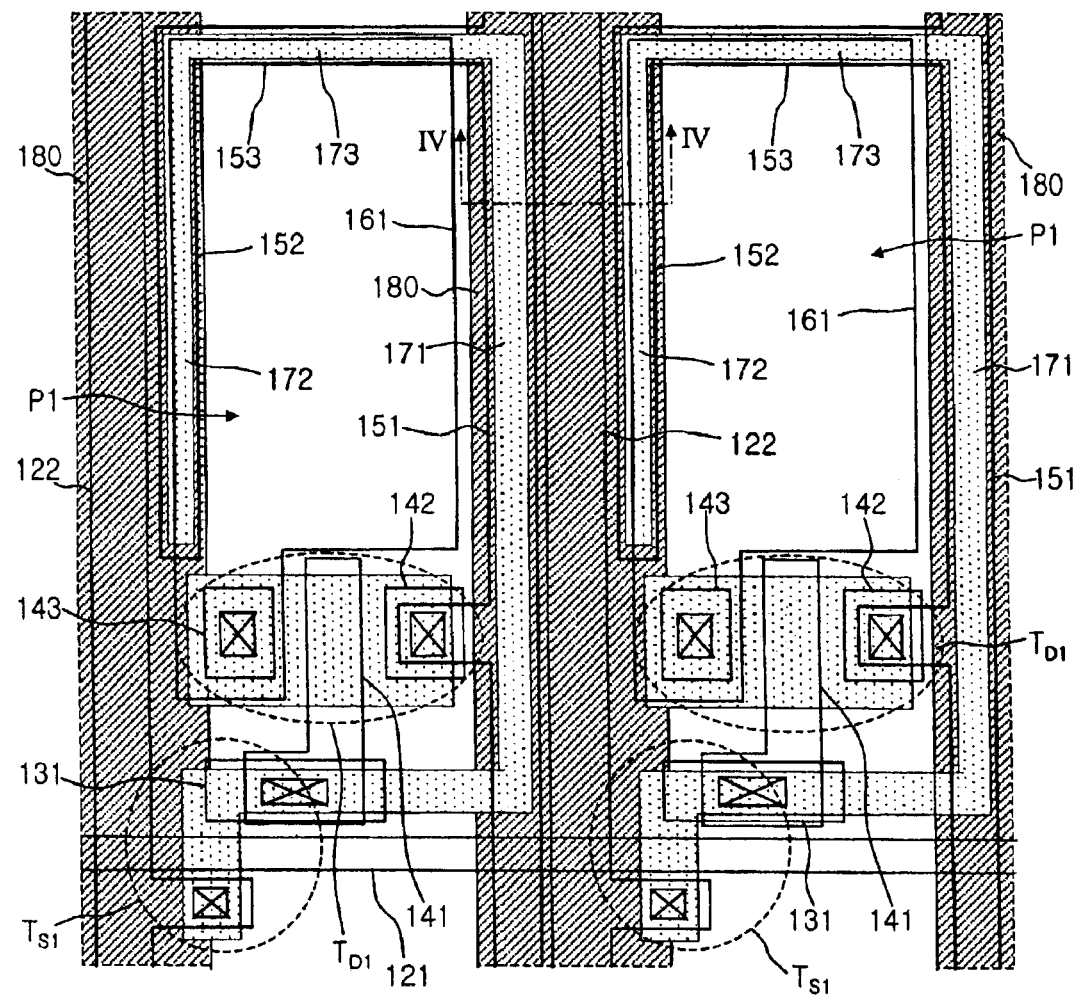
FIG. 3 is a plan view of an exemplary active matrix-type organic electroluminescent display device according to the present invention.

FIG. 3 is a plan view of an exemplary active matrix-type organic electroluminescent display device according to the present invention. In FIG. 3, a gate line 121 may be formed along a horizontal direction and a data line 122 may be formed along a vertical direction perpendicular to the horizontal direction. Accordingly, the gate line 121 and the data line 122 may cross each other, thereby defining a pixel region "P1." At the crossing of the gate and data lines 121 and 122, a switching thin film transistor (TFT) "$T_{S1}$" may be formed and may be connected to the gate line 121 and the data line 122. A part of the gate line 121 may function as a gate electrode of the switching TFT "$T_{S1}$."

Within the pixel region "P1," a driving thin film transistor (TFT) "$T_{D1}$" may be formed, and a gate electrode 141 of the driving TFT "$T_{D1}$" may be electrically connected to a drain electrode 131 of the switching TFT "$T_{S1}$." A source electrode 142 of the driving TFT "$T_{D1}$" may be connected to a power line having first, second, and third portions 151, 152, and 153. A drain electrode 143 of the driving TFT "$T_{D1}$" maybe electrically connected to a pixel electrode 161 formed within the pixel region "P1."

The first portion 151 of the power line may be formed in parallel to the data line 122 and may cross the gate line 121. The second portion 152 of the power line may be formed in parallel to the first portion 151, wherein the third portion 153 interconnects the second portion 152 to the first portion 151. The pixel electrode 161 may be formed to overlap the second and third portions 152 and 153 of the power line. The pixel electrode 161 may include a transparent conductive material, such as indium-tin-oxide (ITO) and indium-zinc-oxide (IZO).

A capacitor electrode may be formed to be electrically connected to the switching TFT "$T_{S1}$," and the driving TFT "$T_{D1}$." The capacitor electrode may include first, second, and third parts 171, 172, and 173. The first and second parts 171 and 172 may be formed in parallel to the data line 122, wherein the third part 173 electrically interconnects the first part 171 and the second part 172. The first, second, and third parts 171, 172, and 173 of the capacitor electrode may be formed to overlap the first, second, and third portions 151, 152, and 153 of the power line, thereby forming a storage capacitor. The capacitor electrode 171, 172, and 173 may include impurity-doped polycrystalline silicon.

A partition wall 180 may be formed to overlap the data line 122, the first and second portions 151 and 152 of the power line, and the first and second parts 171 and 172 of the capacitor electrode. In addition, the partition wall 180 may also be formed to overlap the pixel electrode 161. The partition wall 180 defines a region where an organic emissive layer (not shown) will be formed by exposure of the pixel electrode 161, and may prevent the organic emissive layer from contacting the adjacent pixel region "P1."

Figure 4:
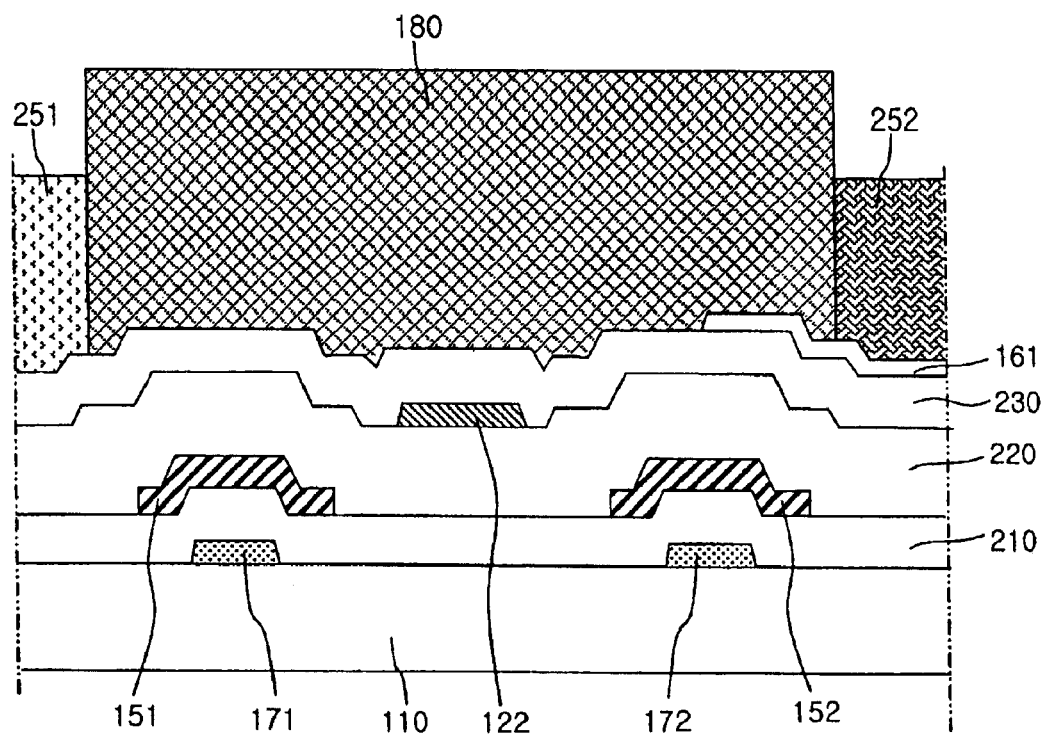
FIG. 4 is a cross sectional view along IV—IV of FIG. 3 according to the present invention.

FIG. 4 is a cross sectional view along IV—IV of FIG. 3 according to the present invention. In FIG. 4, the first and second parts 171 and 172 of the capacitor electrode are formed on a substrate 110, and a first insulator 210 may be formed on the first and second parts 171 and 172 of the capacitor electrode. The first and second portions 151 and 152 of the power line may be formed on the first insulator 210, and the first and second portions 151 and 152 of the power line may be formed to overlap the first and second parts 171 and 172 of the capacitor electrode, thereby forming a storage capacitor.

A second insulator 220 may be formed on the first and second portions 151 and 152 of the power line. In addition, a data line 122 may be formed on the second insulator 220 between the first and second portions 151 and 152 of the power line. A third insulator 230 may be formed on the data line 122, and a pixel electrode 161 may be formed on the third insulator 230 to overlap the second part 172 of the capacitor electrode and the second portion 152 of the power line. Organic emissive layers 251 and 252 may be formed on the pixel electrode 161, and a partition wall 180 may be disposed between the organic emissive layers 251 and 252. The partition wall 180 may be formed to overlap the pixel electrode 161 and to cover the first and second portions 151 and 152 of the power line and the first and second parts 171 and 172 of the capacitor electrode. The organic emissive layers 251 and 252 may emit light of different color wavelengths. Accordingly, since the power line and the capacitor electrode may be formed within a region where the partition wall is formed, the capacitance of the storage capacitor increases while the aperture ratio is not decreased. Therefore, the kickback voltage is reduced, and the quality of the displayed images is improved.

Figure 5:
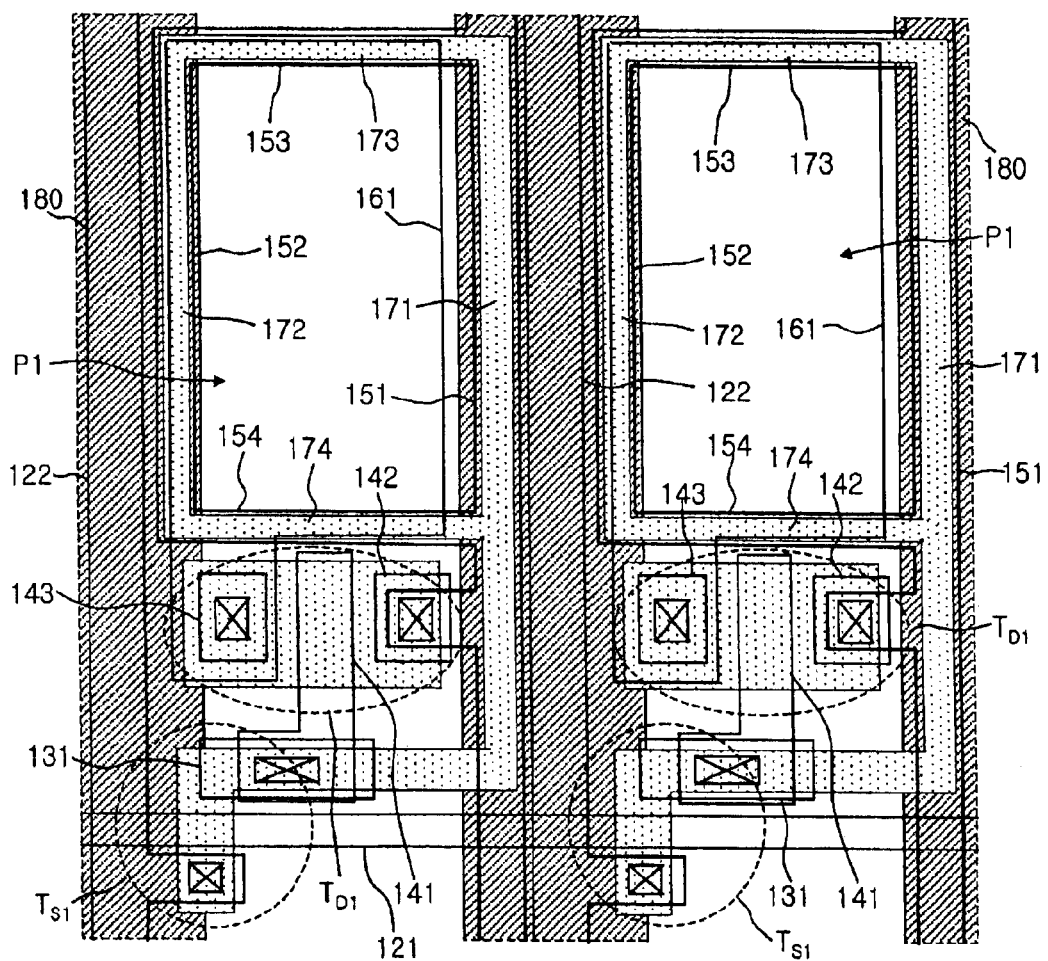
FIG. 5 is a plan view of an exemplary active matrix organic electroluminescent display device according to the present invention.

FIG. 5 is a plan view of an exemplary active matrix organic electroluminescent display device according to the present invention. In FIG. 5, the power line and the capacitor electrode may both have an annular or ring shape. The device shown in FIG. 5 has a similar structure as the device shown in FIG. 3, except for the annular-shaped power line and capacitor electrode. Accordingly, the same symbols used in FIG. 3 are given to the similar parts as the device shown in FIG. 5, and explanation of the same part is omitted for simplicity.

In FIG. 5, a power line may include first, second, third, and fourth portions 151, 152, 153, and 154, wherein the first and second portions 151 and 152 may be formed along a vertical directions and the first portion 151 may cross the gate line 121. The third and fourth portions 153 and 154 may be formed along horizontal directions perpendicular to the vertical directions. The third portion 153 may interconnect a first end of the second portion 152 to the first portion 151, and the fourth portion 154 may interconnect a second end of the second portion 152 to the first portion 151. Thus, the power line 151, 152, 153 and 154 may have an annular or ring shape.

In addition, a capacitor electrode may include first, second, third, and fourth parts 171, 172, 173, and 174, and may be formed to overlap the first, second, third, and fourth portions 151, 152, 153, and 154 of the power line, respectively. Thus, the capacitor electrode 171, 172, 173, and 174 may also have an annular or ring shape concentric with the annular shape of the power line. Accordingly, the pixel electrode 161 may be formed to overlap the second, third, and fourth parts 172, 173, and 174 of the capacitor electrode and the second, third, and fourth portions 152, 153, and 154 of the power line. In the exemplary active matrix organic electroluminescent display device according to the present invention, each pixel may have two TFTs including a switching TFT and a driving TFT. Alternatively, each pixel may have four TFTs to improve image uniformity.

Figure 6:
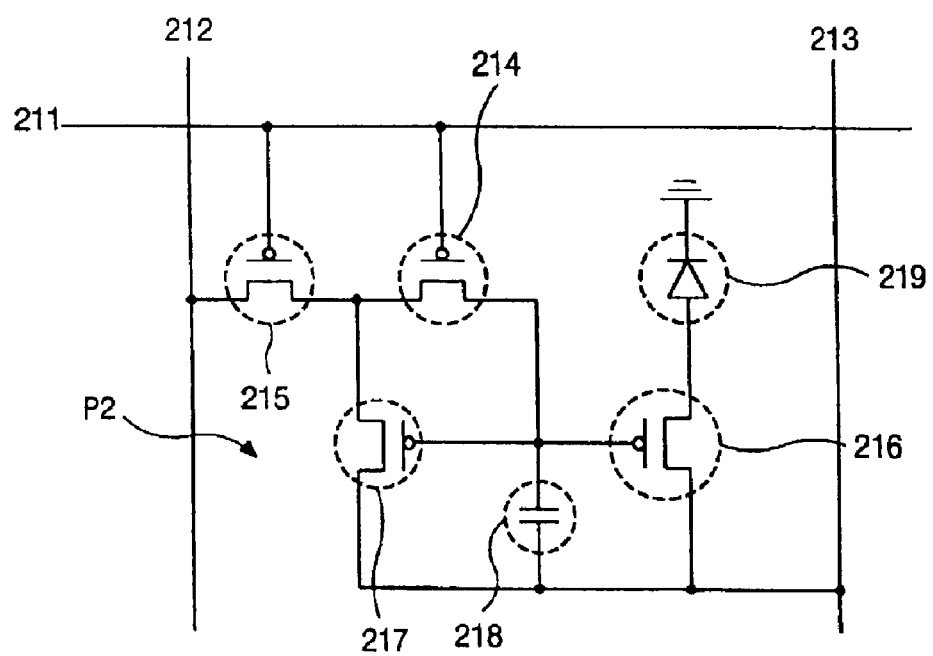
FIG. 6 is a circuit diagram of an exemplary active matrix organic electroluminescent display device according to the present invention.

FIG. 6 is a circuit diagram of an exemplary active matrix organic electroluminescent display device according to the present invention. The device shown in FIG. 6 may have a structure similar to the structure of the device shown in FIG. 3, except for the TFTs. In FIG. 6, a gate line 211 and a data line 212 may be formed to cross each other to define a pixel "P2" that may include first and second switching TFTs 214 and 215, first and second driving TFTs 216 and 217, a storage capacitor 218, and an electroluminescent diode 219. Gate electrodes of the first and second switching TFTs 214 and 215 may be electrically connected to the gate line 211, and a source electrode of the second switching TFT 215 may be electrically connected to the data line 212. A drain electrode of the second switching TFT 215 may be electrically connected to the source electrode of the first switching TFT 214. A source electrode of the second driving TFT 217 may be electrically connected to the drain electrode of the second switching TFT 215 and to the source electrode of the first switching TFT 214. A gate electrode of the second driving TFT 217 may be electrically connected to a drain electrode of the first switching TFT 214 and a gate electrode of the first driving TFT 216.

A source electrode of the first driving TFT 216 may be electrically connected to a drain electrode of the second driving TFT 217 and to a power line 213. A drain electrode of the first driving TFT 216 may be electrically connected to an anode electrode of the electroluminescent diode 219, wherein a cathode electrode of the electroluminescent diode 219 may be grounded. One part of the storage capacitor 218 may be electrically connected to the drain electrode of the second driving TFT 217 and to the source electrode of the first driving TFT 216, and the other part of the storage capacitor 218 maybe electrically connected to the gate electrodes of the first and second driving TFT 216 and 217.

Accordingly, when the first and second switching TFTs 214 and 215 turn ON by a gate signal from the gate line 211, a data signal from the data line 212 is transmitted to the gate electrodes of the first and second driving TFTs 216 and 217. An imaging signal from the power line 213 is transmitted to the electroluminescent diode 219 through the first driving TFT 216 that turns ON by the transmitted data signal, and light is emitted from the electroluminescent diode 219.

It will be apparent to those skilled in the art that various modifications and variations can be made in the active matrix organic electroluminescent display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescent display device, comprising:
    a substrate;
    a gate line disposed on the substrate;
    a data line disposed on the substrate crossing the gate line to form a pixel region;
    a first switching thin film transistor disposed on the substrate and electrically connected to the gate line and the data line;
    a first driving thin film transistor disposed on the substrate and electrically connected to the first switching thin film transistor;
    a capacitor electrode formed on the substrate and electrically connected to the first switching thin film transistor, the capacitor electrode having first and second parts disposed in parallel to the data line and spaced apart from each other, and a third part connecting a first end of the first part to a first end of the second part;
    a power line electrically connected to the first driving thin film transistor, the power line having first, second, and third portions overlapping the capacitor electrode to form a storage capacitor;
    a pixel electrode disposed within the pixel region and electrically connected to the first driving thin film transistor;
    an organic emissive layer disposed on the pixel electrode; and
    a partition wall disposed between adjacent organic layers to overlap the data line and the first and second parts of the capacitor electrode.

2. The device according to claim 1, wherein the pixel electrode overlaps the second and third parts of the capacitor electrode.

3. The device according to claim 1, wherein the capacitor electrode further includes a fourth part connecting a second end of the first part to a second end of the second part.

4. The device according to claim 3, wherein the fourth part of the capacitor electrode overlaps the pixel electrode.

5. The device according to claim 3, wherein the power line further includes a fourth portion overlapping the fourth part of the capacitor electrode.

6. The device according to claim 1, wherein the capacitor electrode includes impurity-doped polycrystalline silicon.

7. The device according to claim 1, further comprising a second switching thin film transistor electrically connected to the gate line and the first switching thin film transistor.

8. The device according to claim 7, further comprising a second driving thin film transistor electrically connected to the first switching thin film transistor and the first driving thin film transistor.

9. The device according to claim 8, wherein the capacitor electrode includes impurity-doped polycrystalline silicon.

10. The device according to claim 7, wherein the pixel electrode overlaps the second and third parts of the capacitor electrode.

11. The device according to claim 7, wherein the capacitor electrode further includes a fourth part connecting a second end of the first part to a second end of the second part.

12. The device according to claim 11, wherein the fourth part of the capacitor electrode overlaps the pixel electrode.

13. The device according to claim 11, wherein the power line further includes a fourth portion overlapping the fourth part of the capacitor electrode.

14. A method of fabricating an active matrix organic electroluminescent display device, comprising steps of:
    forming a gate line on a substrate;
    forming a data line on the substrate crossing the gate line to form a pixel region;
    forming a first switching thin film transistor on the substrate and electrically connected to the gate line and the data line;
    forming a first driving thin film transistor on the substrate and electrically connected to the first switching thin film transistor;
    forming a capacitor electrode electrically connected to the first switching thin film transistor, the capacitor electrode having first and second parts disposed in parallel to the data line and spaced apart from each other, and a third part connecting a first end of the first part to a first end of the second part;
    forming a power line electrically connected to the first driving thin film transistor, the power line having first, second, and third portions overlapping the capacitor electrode to form a storage capacitor;
    forming a pixel electrode disposed within the pixel region and electrically connected to the first driving thin film transistor;
    forming an organic emissive layer disposed on the pixel electrode; and
    forming a partition wall disposed between adjacent organic layers to overlap the data line and the first and second parts of the capacitor electrode.

15. The method according to claim 14, wherein the pixel electrode overlaps the second and third parts of the capacitor electrode.

16. The method according to claim 14, wherein the capacitor electrode further includes a fourth part connecting a second end of the first part to a second end of the second part.

17. The method according to claim 16, wherein the fourth part of the capacitor electrode overlaps the pixel electrode.

18. The method according to claim 16, wherein the power line further includes a fourth portion overlapping the fourth part of the capacitor electrode.

19. The method according to claim 14, wherein the capacitor electrode includes impurity-doped polycrystalline silicon.

20. The method according to claim 14, further comprising a step of forming a second switching thin film transistor electrically connected to the gate line, and the first switching thin film transistor.

21. The method according to claim 20, further comprising a step of forming a second driving thin film transistor electrically connected to the first switching thin film transistor and the first driving thin film transistor.

22. The method according to claim 14, wherein the pixel electrode overlaps the second and third parts of the capacitor electrode.

23. The method according to claim 14, wherein the capacitor electrode further includes a fourth part connecting a second end of the first part to a second end of the second part.

24. The method according to claim 23, wherein the fourth part of the capacitor electrode overlaps the pixel electrode.

25. The method according to claim 23, wherein the power line further includes a fourth portion overlapping the fourth part of the capacitor electrode.

26. The method according to claim 14, wherein the capacitor electrode includes impurity-doped polycrystalline silicon.

* * * * *